US 011629626B2

(12) United States Patent
Yoshihara et al.

(10) Patent No.: US 11,629,626 B2
(45) Date of Patent: Apr. 18, 2023

(54) HEAT RECOVERY DEVICE AND HEAT RECOVERY SYSTEM

(71) Applicant: NGK INSULATORS, LTD., Nagoya (JP)

(72) Inventors: Makoto Yoshihara, Iwakura (JP); Ryushiro Akaishi, Nagoya (JP); Tatsuo Kawaguchi, Mizuho (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 17/451,220

(22) Filed: Oct. 18, 2021

(65) Prior Publication Data

US 2022/0213827 A1 Jul. 7, 2022

(30) Foreign Application Priority Data

Jan. 7, 2021 (JP) .............................. JP2021-001700

(51) Int. Cl.
| *F01N 5/02* | (2006.01) |
| *F01N 3/28* | (2006.01) |
| *B01D 53/94* | (2006.01) |
| *H01L 35/32* | (2006.01) |

(52) U.S. Cl.
CPC ......... *F01N 5/025* (2013.01); *B01D 53/9454* (2013.01); *F01N 3/2803* (2013.01); *H01L 35/32* (2013.01); *B01D 2255/9155* (2013.01)

(58) Field of Classification Search
CPC .... F01N 3/2803; F01N 3/2828; F01N 3/0222; F01N 5/025; F01N 2330/06; F01N 2330/30; F01N 2330/02; B01D 53/9494; B01D 2255/9155; H01L 35/32
See application file for complete search history.

(56) References Cited

U.S. PATENT DOCUMENTS

| 9,145,812 | B2* | 9/2015 | An ....................... F01N 5/025 |
| 2012/0073276 | A1* | 3/2012 | Meisner ................ H01L 35/30 |
| | | | 60/320 |
| 2018/0230884 | A1* | 8/2018 | Kawaguchi ............. F01N 5/02 |
| 2020/0141299 | A1 | 5/2020 | Kawaguchi et al. |

FOREIGN PATENT DOCUMENTS

WO  2019/026560 A1  2/2019

* cited by examiner

*Primary Examiner* — Audrey B. Walter
*Assistant Examiner* — Dapinder Singh
(74) *Attorney, Agent, or Firm* — Burr Patent Law, PLLC

(57) ABSTRACT

A heat recovery device includes: a honeycomb structure including an outer peripheral wall having at least one outer peripheral surface, and partition walls arranged on an inner side of the outer peripheral wall, the partition walls defining a plurality of cells each extending from a first end face to a second end face to form a flow path for a first fluid; a thermoelectric conversion element arranged to face the outer peripheral surface of the outer peripheral wall; a cylindrical member that circumferentially covers the honeycomb structure in which the thermoelectric conversion element is arranged; a casing arranged at an interval so as to form a flow path for a second fluid, the casing being arrange on a radially outer side of the cylindrical member; and a pressing member being configured to press the cylindrical member against the thermoelectric conversion element. The cylindrical member has one or more slit portions.

12 Claims, 6 Drawing Sheets

HEAT RECOVERY DEVICE AND HEAT RECOVERY SYSTEM

FIELD OF THE INVENTION

The present invention relates to a heat recovery device and a heat recovery system.

BACKGROUND OF THE INVENTION

Recently, there is a need for improvement of fuel economy of motor vehicles. In particular, a system is expected to warm up cooling water, ATF (Automatic Transmission Fluid) and the like at an early stage to reduce friction losses, in order to prevent deterioration of fuel economy at the time when an engine is cold, such as at engine startup. Further, a system is expected that heats an exhaust gas purifying catalyst in order to activate the catalyst at an early stage.

As such a system, for example, there is a heat exchanger. The heat exchanger is a device including a member (a heat exchange member) for exchanging heat by allowing the first fluid to flow inside and the second fluid to flow outside. In such a heat exchanger, for example, the heat can be effectively utilized by exchanging the heat from the first fluid having a higher temperature (for example, an exhaust gas) to the second fluid having a lower temperature (for example, cooling water).

There are also known arts for improve a fuel efficiency by converting heat energy contained in an automobile exhaust gas to electrical energy to recovery it, which is then effectively utilized to charge batteries and drive electrical components.

For example, Patent Literature 1 proposes a heat recovery device, including: a pillar shaped honeycomb structure which has an outer peripheral wall having at least one planar outer peripheral surface, and a plurality of partition walls arranged inside the outer peripheral wall, the partition walls defining a plurality of cells each penetrating from a first end face to a second end face to form a flow path for a first fluid; a thermoelectric conversion element (thermoelectric conversion module) arranged to the planar outer peripheral surface of the outer peripheral wall; a cylindrical member that circumferentially covers the honeycomb structure in which the thermoelectric conversion element is arranged; and a casing that circumferentially covers the cylindrical member, wherein a flow path for a second fluid is formed between an inner peripheral surface of the casing and an outer peripheral surface of the cylindrical member. Further, Patent Literature 1 proposes that the cylindrical member is pressed by screws inserted from the outer peripheral side of the casing, or by springs each interposed between the casing and the cylindrical member.

CITATION LIST

Patent Literature

[Patent Literature 1] WO 2019/026560 A1

SUMMARY OF THE INVENTION

The above problems are solved by the present invention as described below. The present invention is specified as follows:

The present invention relates to a heat recovery device, comprising:

a honeycomb structure comprising an outer peripheral wall having at least one planar outer peripheral surface, and partition walls arranged on an inner side of the outer peripheral wall, the partition walls defining a plurality of cells each extending from a first end face to a second end face to form a flow path for a first fluid;

a thermoelectric conversion element arranged to the planar outer peripheral surface of the outer peripheral wall;

a cylindrical member that circumferentially covers the honeycomb structure in which the thermoelectric conversion element is arranged;

a casing arranged at an interval so as to form a flow path for a second fluid, the casing being arrange on a radially outer side of the cylindrical member; and a pressing member being configured to press the cylindrical member against the thermoelectric conversion element, wherein the cylindrical member has one or more slit portions.

The present invention relates to a heat recovery device, comprising:

a honeycomb structure comprising an outer peripheral wall having at least one planar outer peripheral surface, and partition walls arranged on an inner side of the outer peripheral wall, the partition walls defining a plurality of cells each extending from a first end face to a second end face to form a flow path for a first fluid;

a thermoelectric conversion element arranged to face the planar outer peripheral surface of the outer peripheral wall;

a cylindrical member that circumferentially covers the honeycomb structure in which the thermoelectric conversion element is arranged;

a casing arranged at an interval so as to form a flow path for a second fluid, the casing being arrange on a radially outer side of the cylindrical member;

a pressing member being configured to press the cylindrical member against the thermoelectric conversion element; and a buffer member arranged between the cylindrical member and the thermoelectric conversion element, the buffer member being in contact with an inner surface of the cylindrical member.

Further, the present invention relates to a heat recovery system, comprising:

a one-way path for a first fluid;

a circulation path for a second fluid having a lower temperature than that of the first fluid;

a heat recovery device arranged in the middle of the one-way path for the first fluid and the circulation path for the second fluid; and a battery electrically connected to the heat recovery device, the battery storing electricity generated by the heat recovery device.

DETAILED DESCRIPTION OF THE INVENTION

The heat recovery device described in Patent Literature 1 has a good ability to effectively use waste heat, but it has a problem that the output of electrical energy gradually decreases when the first fluid is circulated at an elevated temperature (e.g., 700° C.).

The present invention was made to solve the above problems. An object of the present invention is to provide a heat recovery device and a heat recovery system, which can suppress reduction of an output of electric energy.

According to the present invention, it is possible to provide a heat recovery device and a heat recovery system, which can suppress reduction of an output of electric energy.

Hereinafter, embodiments of the present invention will be specifically described with reference to the drawings. It is to understand that the present invention is not limited to the following embodiments, and those which appropriately added changes, improvements and the like to the following embodiments based on knowledge of a person skilled in the art without departing from the spirit of the present invention fall within the scope of the present invention.

As a result of investigating causes of the problem of reduced output of electric energy, the present inventors have found that the problem has been caused by a partial decrease in a pressing force of the cylindrical member against the thermoelectric conversion element due to a gap between thermoelectric conversion element and the cylindrical member caused by the continued circulation of the first fluid. To solve the problem, the present inventors have found that the partial decrease in the pressing force of the cylindrical member against the thermoelectric conversion element could be suppressed by embodiments as described below.

Embodiment 1

(1) Heat Recovery Device

Figure 1:
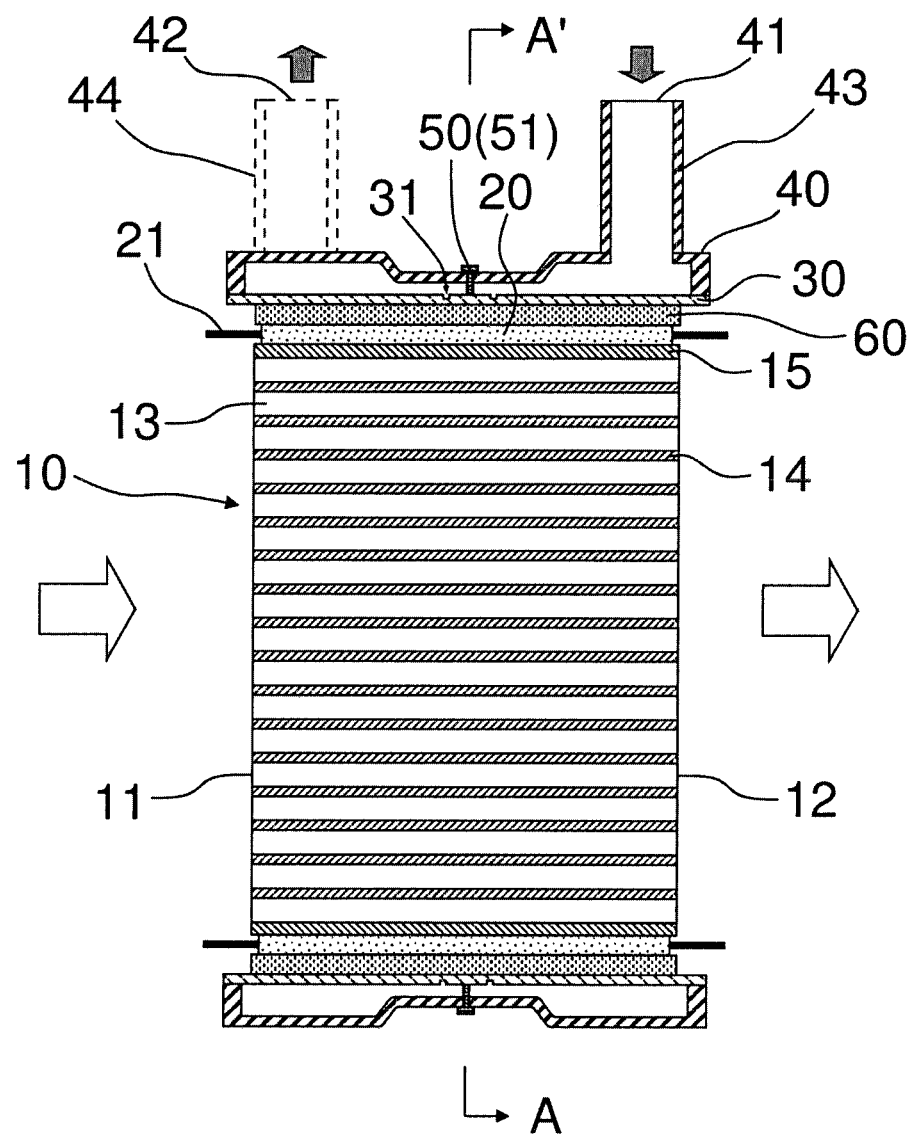
FIG. 1 is a view for explaining a structure of a heat recovery device according to Embodiment 1 of the present invention in a cross section parallel to an axial direction (a cell extending direction) of a honeycomb structure.
Figure 2:
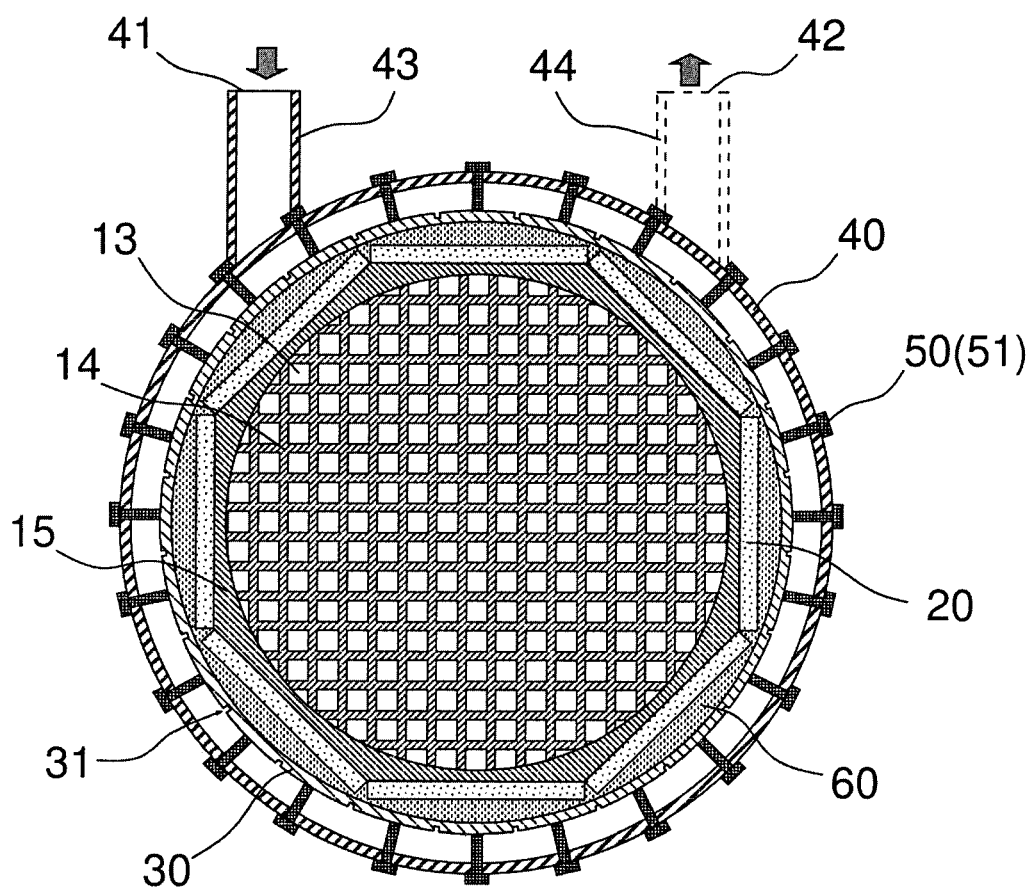
FIG. 2 is a view for explaining a structure of a heat recovery device according to Embodiment 1 of the present invention in a cross section orthogonal to an axial direction (a cell extending direction) of a honeycomb structure.

FIG. 1 shows a structure of a heat recovery device according to Embodiment 1 of the present invention in a cross section parallel to an axial direction (a cell extending direction) of a honeycomb structure. FIG. 2 shows the structure of the heat recovery device according to Embodiment 1 of the present invention in a cross section (a cross section taken along the A-A' line) perpendicular to the axial direction (cell extending direction) of the honeycomb structure.

The dotted lines in the figures are imaginary lines of an outflow port and an outlet conduit present in the other cross section.

As shown in FIGS. 1 and 2, a heat recovery device 100 includes: a honeycomb structure 10 including an outer peripheral wall 15 having at least one planar outer peripheral surface, and partition walls 14 arranged on an inner side of the outer peripheral wall 15, the partition walls 14 defining a plurality of cells 13 each extending from a first end face 11 to a second end face 12 to form a flow path for a first fluid.

The heat recovery device 100 also includes a thermoelectric conversion element 20 arranged to face the planar outer peripheral surface of the outer peripheral wall 15 of the honeycomb structure 10.

The heat recovery device 100 also includes a cylindrical member 30 that circumferentially covers the honeycomb structure 10 in which the thermoelectric conversion element 20 is arranged.

The heat recovery device 100 also includes a casing 40 arranged at an interval so as to form a flow path for a second fluid, the casing 40 being arrange on a radially outer side of the cylindrical member 30.

The heat recovery device 100 also provides a pressing member 50 being configured to press the cylindrical member 30 against the thermoelectric conversion element 20.

(1-1) Honeycomb Structure 10

The honeycomb structure 10 includes: the outer peripheral wall 15 having the flat outer peripheral surface; and the partition walls 14 that are arranged on an inner side of the outer peripheral wall 15 and define the plurality of cells 13 each extending from the first end face 11 to the second end face 12 to form the flow path for the first fluid. The use of the honeycomb structure 10 having such a structure can allow heat of the first fluid passing through the cells 13 of the honeycomb structure 10 to be efficiently collected and transferred to the outside. The first fluid can pass from the first end face 11 to the second end face 12, i.e., in the direction of the arrow (from the left to the right side of the paper in FIG. 1), or in the direction from the front to the back of the paper in FIG. 2. The first fluid is not particularly limited, and various liquids and gases may be used. For example, the first fluid can be an exhaust gas if the heat recovery device 100 is installed in an exhaust line of a combustion engine or a combustion device. In particular, if the heat recovery device 100 is installed in an exhaust line of a motor vehicle, the first fluid can be an exhaust gas from an engine.

The outer peripheral wall 15 of the honeycomb structure 10 has at least one planar outer peripheral surface. The thermoelectric conversion element 20 is often in a flat plate shape. Since the honeycomb structure 10 has the planar outer peripheral surface, the thermoelectric conversion element 20 to be easily arranged to face the planar outer peripheral surface of the outer peripheral wall 15. Also, the face-to-face arrangement is expected to improve a heat transfer efficiency. From the viewpoint of enabling installation of a plurality of thermoelectric conversion element 20, the outer peripheral wall 15 of the honeycomb structure 10 preferably has a plurality of planar outer peripheral surfaces, and more preferably three or more planar outer peripheral surfaces. The honeycomb structure 10 preferably has a rectangular prismatic pillar shape in terms of manufacturability and heat recovery efficiency. In this case, the three or more outer peripheral surfaces of the peripheral wall 15 are all planar.

In order to increase the utilization efficiency of the heat from the honeycomb structure 10, the entire one main surface (higher-temperature side) of the thermoelectric conversion element 20 is preferably in direct or indirect contact with the outer peripheral surface of the outer peripheral wall 15. When the entire one main surface (higher-temperature side) of the thermoelectric conversion element 20 is in indirect contact with the outer peripheral surface of the outer peripheral wall 15, the one main surface (higher-temperature side) of the thermoelectric conversion element 20 is preferably in contact with the outer peripheral surface of the outer peripheral wall 15 via a substance for reducing contact thermal resistance. The substance for reducing the contact thermal resistance includes metal plates, carbon (graphite) sheets, thermal sheets, thermal greases, and the like. Specific examples of metals for the metal plates include soft metals such as aluminum, copper, and lead, and alloys such as solder.

When the honeycomb structure 10 has the rectangular prismatic pillar shape, non-limiting examples of the rectangular prismatic pillar include triangular, square, pentagonal, hexagonal, heptagonal, octagonal, or other rectangular prismatic pillars. Among these, for easy assembly, it is preferable that the opposing outer peripheral surfaces are parallel to each other, and that the number of outer peripheral surfaces is an even number (e.g., square, hexagonal, octagonal, etc.). The rectangular prismatic pillar is typically a right-angled prismatic pillar. In order to make it easier to equalize the contact state (pressing pressure, etc.) of the thermoelectric conversion element 20 with each outer peripheral surface, the outline of the rectangular prismatic pillar is preferably symmetrical, and the external shape of the honeycomb structure 10 preferably has a right-angled prismatic pillar shape in which both ends have regular polygons. FIGS. 1 and 2 illustrate the case where the external shape of the honeycomb structure 10 is a regular octagonal prismatic pillar as an example.

The outer peripheral surface of the outer peripheral wall 15 is determined depending on the outer shape of the honeycomb structure 10. If the outer shape of the honeycomb structure 10 is the rectangular prismatic pillar shape, the outer peripheral surface of the outer peripheral wall 15 has a polygonal cross section perpendicular to the axial direction of the honeycomb structure 10. On the other hand, the shape of the inner peripheral surface of the outer peripheral wall 15 is not particularly limited. For example, in the cross section perpendicular to the axial direction of the honeycomb structure 10, the inner peripheral surface of the outer peripheral wall 15 may have a polygonal shape corresponding to the outer peripheral surface of the outer peripheral wall 15, or may have a shape that does not correspond to the outer peripheral surface of the outer peripheral wall 15. FIGS. 1 and 2 illustrate that in the cross section perpendicular to the axial direction of the honeycomb structure 10, the outer peripheral surface of the outer peripheral wall 15 has a regular octagonal shape while the inner peripheral surface of the outer peripheral wall 15 has a circular shape.

It is preferable that the entire region located on more inner side than the inner peripheral surface of the outer peripheral wall 15 of the honeycomb structure 10 is composed of a plurality of cells 13 in the axial direction of the honeycomb structure 10. This structure can increase the number of the partition walls 14 for heat transfer, thereby increasing a recovery efficiency of heat from the first fluid.

The honeycomb structure 10 may be of a hollow type. In this case, the hollow type honeycomb structure 10 has a hollow portion that serves as a flow path for the first fluid penetrating from the center of the first end face 11 to the center of the second end face 12 in the cross section perpendicular to the axial direction of the honeycomb structure 10, and is provided with the plurality of cells 13 on the outer peripheral side of the hollow portion.

The hollow portion of the honeycomb structure 10 can be provided with an inner cylindrical member having a branched path that branches into a path through the hollow portion and a path through the plurality of cells 13. By arranging a flow control valve upstream of the first end face 11 or downstream of the second end face 12 of the honeycomb structure 10 and in the middle of one or both of the paths passing through the hollow portion and the plurality of cells 13, a ratio of flow rates of the first fluid passing through the hollow portion and the first fluid passing through the plurality of cells 13 can be adjusted. The flow control valve can be of any known structure, including, example, a gate valve, butterfly valve, ball valve, and the like. The flow control valve can be manually opened and closed, or it can be automatically opened and closed by a pneumatic or electric actuator. It can also be opened and closed using an actuator (thermo actuator, thermostat, etc.) that utilizes a volume change of a material (wax, etc.) depending on temperatures.

A shape of each cell 13 in the cross section orthogonal to the axial direction of the honeycomb structure 10 is not particularly limited. A desired shape may be selected from circular, elliptical, triangular, quadrangular, hexagonal or other polygonal shapes. It should be noted that FIGS. 1 and 2 illustrate the case where the cross-sectional shape of each cell 13 is a rectangle. Further, the cells 13 may have shapes surrounded by the partition walls 14 extending in the circumference direction and by the partition walls 14 extending in the radial direction. Such a shape can increase thermal conductivity in the radial direction, so that the heat of the first fluid passing though the cells 13 can be efficiently transferred to the outside of the honeycomb structure 10.

The partition walls 14 and the outer peripheral wall 15 preferably contain ceramics as a main component. The phrase "contain ceramics as a main component" means that a ratio of a mass of ceramics to the total mass of the partition walls 14 or the outer peripheral wall 15 is 50% by mass or more.

Each of the partition walls 14 and the outer peripheral wall 15 preferably has a porosity of 10% or less, and more preferably 5% or less, and even more preferably 3% or less. Further, the porosity of the partition walls 14 and the outer peripheral wall 15 may be 0%. The porosity of the partition walls 14 and the outer peripheral wall 15 of 10% or less can lead to improvement of thermal conductivity.

The partition walls 14 and the outer peripheral wall 15 preferably contain SiC (silicon carbide) having high thermal conductivity as a main component. The phrase "contain SiC (silicon carbide) as a main component" means that a ratio of a mass of SiC (silicon carbide) to the total mass of the partition walls 14 or the outer peripheral wall 15 is 50% by mass or more.

More particularly, the material of the partition walls 14 and the outer peripheral wall 15 that can be used herein includes Si-impregnated SiC, (Si+Al) impregnated SiC, metal composite SiC, recrystallized SiC, $Si_3N_4$, SiC, and the like.

A cell density (that is, the number of cells per unit area) in the cross section orthogonal to the axial direction of the pillar shaped honeycomb structure 10 is not particularly limited. The cell density may be adjusted as needed, and preferably in a range of from 4 to 320 cells/$cm^2$. The cell density of 4 cells/$cm^2$ or more can sufficiently ensure the strength of the partition walls 14, hence the strength of the honeycomb structure 10 itself and effective GSA (geometrical surface area). Further, the cell density of 320 cells/$cm^2$ or less can allow prevention of an increase in a pressure loss when the first fluid flows.

The honeycomb structure 10 preferably has an isostatic strength of 1 MPa or more, and more preferably 5 MPa or more. The isostatic strength of the honeycomb structure 10 of 1 MPa or more can lead to the honeycomb structure 1 having improved durability. It should be noted that the upper limit of the isostatic strength of the honeycomb structure 10 is about 100 MPa. The isostatic strength of the honeycomb structure 10 can be measured according to the method for measuring isostatic fracture strength as defied in the JASO standard M 505-87 which is a motor vehicle standard issued by Society of Automotive Engineers of Japan, Inc.

A diameter of the honeycomb structure 10 in the cross section orthogonal to the axial direction of the honeycomb structure may preferably be from 20 to 200 mm, and more preferably from 30 to 100 mm. Such a diameter can allow improvement of heat recovery efficiency. As used herein, the diameter of the honeycomb structure 10 refers to a diameter of the largest inscribed circle that is inscribed in the outer peripheral surface of the honeycomb structure 10 in the cross section orthogonal to the axial direction of the honeycomb structure 10.

A thickness of each partition wall 14 may be designed depending on purposes, but is not particularly limited. The thickness of each partition wall 14 may preferably be from 0.1 to 1 mm, and more preferably from 0.2 to 0.6 mm. The thickness of the partition wall 14 of 0.1 mm or more can provide the honeycomb structure 10 with a sufficient mechanical strength and can prevent it from being broken by impact or thermal stress. Further, the thickness of the partition wall 14 of 1 mm or less can suppress a problem that the pressure loss is increased or the heat recovery efficiency is decreased.

The partition wall 14 may preferably have a density of from 0.5 to 5 $g/cm^3$. The density of the partition wall 14 of 0.5 $g/cm^3$ or more can provide the partition wall 14 with a sufficient strength and prevent the partition wall 14 from being broken by resistance when the first fluid passes through the flow path (the cells 13). Further, the density of the partition wall 14 of 5 $g/cm^3$ or less can allow weight reduction of the honeycomb structure 10. The density within the above range can allow the honeycomb structure 10 to be strengthened and can also provide an effect of improving the thermal conductivity. It should be noted that the density of the partition wall 14 is a value measured by the Archimedes method.

The honeycomb structure 10 preferably has a thermal conductivity of 50 W/(m·K) or more at 25° C., and more preferably from 100 to 300 W/(m·K), and even more preferably from 120 to 300 W/(m K). The thermal conductivity of the honeycomb structure 10 in such a range can lead to an improved thermal conductivity and can allow the heat inside the honeycomb structure 10 to be efficiently transmitted to the thermoelectric conversion element 20. It should be noted that the value of thermal conductivity is a value measured according to the laser flash method (JIS R 1611-1997).

In the case where an exhaust gas as the first fluid flows through the cells 13 in the honeycomb structure 10, a catalyst may be supported on the partition walls 14 of the honeycomb structure 10. The supporting of the catalyst on the partition walls 14 can allow CO, NOx, HC and the like in the exhaust gas to be converted into harmless substances through catalytic reaction, and can also allow reaction heat generated during the catalytic reaction to be utilized for heat exchange. Preferable catalysts include those containing at least one element selected from the group consisting of noble metals (platinum, rhodium, palladium, ruthenium, indium, silver and gold), aluminum, nickel, zirconium, titanium, cerium, cobalt, manganese, zinc, copper, tin, iron, niobium, magnesium, lanthanum, samarium, bismuth, and barium. Any of the above-listed elements may be contained as a metal simple substance, a metal oxide, or other metal compound.

A supported amount of the catalyst (catalyst metal+ support) may preferably be from 10 to 400 g/L. Further, when using the catalyst containing the noble metal(s), the supported amount may preferably be from 0.1 to 5 g/L. The supported amount of the catalyst (catalyst metal+support) of 10 g/L or more can easily achieve catalysis. The support refers to a carrier on which the catalyst metal is supported. Examples of the supports include those containing at least one selected from the group consisting of alumina, ceria and zirconia.

(1-2) Thermoelectric Conversion Element 20

The thermoelectric conversion element 20 is arranged to face the planar outer peripheral surface of the outer peripheral wall 15 of the honeycomb structure 10. The thermoelectric conversion element 20 may be arranged to face a part of the outer peripheral surface of the outer peripheral wall 15 of the honeycomb structure 10, but it is preferable to arrange the thermoelectric conversion element 20 to face the entire outer peripheral surface of the outer peripheral wall 15 in terms of improvement of a heat utilization efficiency. Each thermoelectric conversion element 20 can convert heat to electricity by the Seebeck effect when there is a temperature difference between the two ends. In the present invention, the temperature difference between the first fluid at a higher temperature and the second fluid at a lower temperature is used to operate the thermoelectric conversion element 20 to convert thermal energy to electrical energy. The electricity generated by the thermoelectric conversion element 20 can be supplied to various electronic devices via electric wires 21, for example, or stored in a battery.

In the thermoelectric conversion element 20, for example, a heat receiving substrate made of insulated ceramics and a heat dissipating substrate made of insulated ceramics are arranged at both ends, and N-type thermoelectric conversion element and P-type thermoelectric conversion element alternately connected in series via electrodes are arranged between them. The adjacent thermoelectric conversion element 20 may be electrically connected via wiring. Typically, the heat receiving substrate is placed at the end of the thermoelectric conversion element 20 closer to the first fluid, and the heat dissipating substrate is placed at the end of the thermoelectric conversion element 20 closer to the second fluid.

A shape of each thermoelectric conversion element 20 is not particularly limited. However, the thermoelectric conversion element having a flat plate shape is readily available in the market and is preferable in that it allows the heat recovery device to be compact. The flat-plate thermoelectric conversion element 20 can be easily arranged to the planar outer peripheral surface of the outer peripheral wall 15 of the honeycomb structure 10.

(1-3) Cylindrical Member 30

The cylindrical member 30 circumferentially covers the honeycomb structure 10 in which the thermoelectric conversion element 20 is arranged. The cylindrical member 30 can have an effect of retaining the shape of the structure in which the thermoelectric conversion element 20 is arranged to face the outer peripheral surface of the outer peripheral wall 15 of the honeycomb structure 10 so that the structure is not collapsed, and an effect of suppressing the mixing of the first fluid and the second fluid. In order to enhance the shape retaining effect, it is preferable that the inner peripheral surface of the cylindrical member 30 is directly or indirectly fitted and fixed to the outer peripheral portions of the thermoelectric conversion element 20. As used herein, the "fitted and fixed" means that members are fixed in a state of being suited to each other. Therefore, the term "fitted and fixed" encompasses cases where members are fixed to each other by a fixing method based on fitting such as clearance fitting, interference fitting and shrinkage fitting, as well as by brazing, welding, diffusion bonding, or the like.

In terms of improvement of the heat recovery efficiency, a higher ratio of an area of a portion of the outer peripheral surface of the outer peripheral wall 15, which is circumferentially covered with the cylindrical member 30, to the total area of the outer peripheral surface of the outer peripheral wall 15 is preferable. Specifically, the area ratio is preferably 80% or more, and more preferably 90% or more, and even more preferably 100% (that is, the entire outer peripheral surface of the outer peripheral wall 15 is circumferentially covered with the cylindrical member 30). It should be noted that the term "outer peripheral surface" as used herein refers to the surface parallel to the axial direction of the honeycomb structure 10, but does not include the surface orthogonal to the axial direction of the honeycomb structure 10.

A material of the cylindrical member 30 is not particularly limited as long as it can produce the above effects, but a material having good thermal conductivity is preferable. Examples of the material include metals and ceramics, and the metals are preferable in terms of manufacturability (ease of assembly). The metals that can be used herein include stainless steel, titanium alloys, copper alloys, aluminum alloys, brass and the like. Among them, the stainless steel is preferable because of high durability.

The cylindrical member 30 preferably has a thickness of 0.1 mm or more, and more preferably 0.3 mm or more, and still more preferably 0.5 mm or more, in terms of ensuring durability and reliability. The thickness of the cylindrical member 30 is preferably 10 mm or less, and more preferably 5 mm or less, and still more preferably 3 mm or less, in terms of reducing thermal resistance.

The cylindrical member 30 has one or more slit portions 31. By providing the slit portions 31 to the cylindrical member 30, it is possible to suppress partial deformation of the cylindrical member 30 due to exposure to elevated temperature. More particularly, when the honeycomb structure 10 is made of ceramics and the cylindrical member 30 is made of a metal, the cylindrical member 30 that does not have the slit portions 31 may be deformed at a portion of the cylindrical member 30 that is not pressed against the thermoelectric conversion element 20 by the pressing member 50, due to a difference in thermal deformation caused by the difference in materials, so that the pressing force against the thermoelectric conversion element 20 in that portion will be reduced. On the other hand, by providing the slit portions 31 to the cylindrical member 30, the thermal stress in the portion that is not pressed against the thermoelectric conversion element 20 by the pressing member 50 can be relaxed to suppress the deformation. As a result, even if the cylindrical member 30 is exposed to elevated temperature, the pressing force of the cylindrical member 30 against the thermoelectric conversion element 20 is difficult to decrease, thereby enabling stable maintenance of the output of electric energy.

The slit portions 31 can be provided on the outer peripheral surface, the inner peripheral surface or both of them of the cylindrical member 30. By providing the slit portions 31 at such a position, it is possible to stably suppress partial deformation of the cylindrical member 30 due to exposure to elevated temperature. FIGS. 1 and 2 illustrate the case where the slit portions 31 are provided on the outer peripheral surface of the cylindrical member 30 as an example.

The number and widths of the slit portions 31 can be appropriately set depending on pressing points by the pressing member 50 and the size of the cylindrical member 30, which are not particularly limited.

Here, FIGS. 3A-3D show schematic views illustrating a relationship between a pressing point P and the slit portion 31.

Figure 3A:
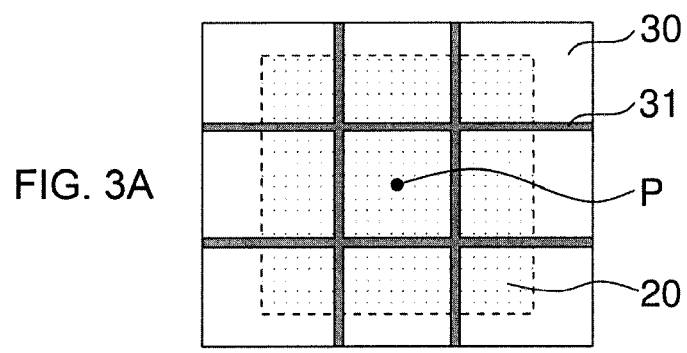
FIGS. 3A-3D are schematic views showing a relationship between a pressing point and a slit portion.
Figure 3B:
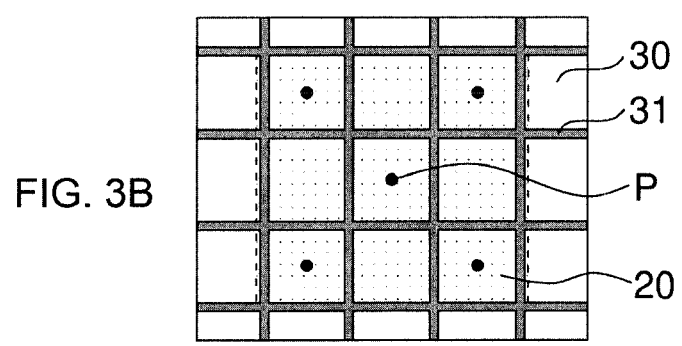
Figure 3C:
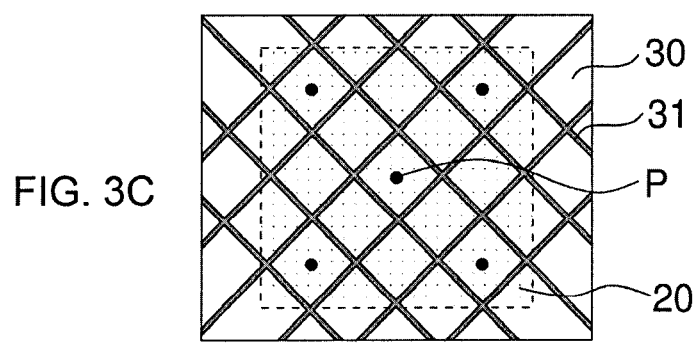
Figure 3D:
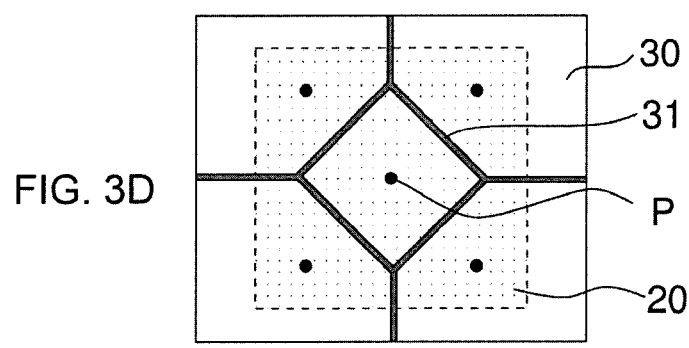

FIG. 3A is an example of the case where the cylindrical member 30 is pressed at the pressing point P by one pressing member 50 against one thermoelectric conversion element 20, and FIGS. 3B to 3D are examples of the case where the cylindrical member 30 is pressed at the pressing points P by five pressing members 50 against one thermoelectric conversion element 20.

The slit portions 31 are preferably provided at positions that do not overlap with the pressing points P of the cylindrical member 30 by the pressing member 50, as shown in FIGS. 3A to 3D. By providing the slit portions 31 at such positions, the partial deformation of the cylindrical member 30 can be suppressed without interfering with the function of the pressing member 50 that press the cylindrical member 30 against the thermoelectric conversion elements 20.

The slit portions 31 are preferably provided in a mesh pattern, as shown in FIGS. 3A to 3C. By providing the slit portions 31 in the mesh pattern, the partial deformation can be suppressed over the entire cylindrical member 30.

If the pressing points P by the pressing member 50 are not present in regions divided by the slit portions 31, it may be difficult to apply a pressure to the regions, so that the pressing force of the cylindrical member 30 against the thermoelectric conversion element 20 may decrease. Therefore, it is preferable that a difference between the number of regions divided by the slit portions 31 and the number of the pressure points P by the pressing member 50 is smaller, and it is more preferable that there is the pressure point P by the pressing member 50 in each of the regions divided by the slit portions 31, as shown in FIG. 3D.

Although the depth of each slit portion 31 is not particularly limited, it is preferably 50% or less, and more preferably 40% or less, and even more preferably 30% or less of the thickness of the cylindrical member 30. By controlling the depth of each slit portion 31 in such a range, the durability and reliability of the cylindrical member 30 can be ensured. The depth of the slit portion 31 is preferably 5% or more, and more preferably 8% or more, and even more preferably 10% or more of the thickness of the cylindrical member 30. By controlling the depth of the slit portion 31 in such a range, thermal stress in the portion that is not pressed against the thermoelectric conversion element 20 by the pressing member 50 can be relaxed in a stable manner.

The width of each slit portion 31 is typically from 0.5 to 2.0 mm.

(1-4) Casing 40

The casing 40 is disposed at an interval on the radially outer side of the cylindrical member 30 so as to form a flow path for the second fluid. The casing 40 has an inflow port 41 and an outflow port 42 for the second fluid having a lower temperature than that of the first fluid, and the flow path for the second fluid is formed between an inner peripheral surface of the casing 40 and the outer peripheral surface of the cylindrical member 30 so as to surround the cylindrical member 30. The flow path for the second fluid is not provided separately for each thermoelectric conversion element 20, but is provided to go around the cylindrical member 30. Therefore, the flow path for the second fluid can be easily constructed.

The casing 40 can have an inlet conduit 43 connected to the inflow port 41 for the second fluid, and an outlet conduit 44 connected to the outflow port 42 for the second fluid. The second fluid flows into the casing 40 from the inflow port 41 through the inlet conduit 43. The second fluid then flows out of the outflow port 42 through the outlet conduit 44 after exchanging heat with the first fluid while the second fluid passes through the flow path for the second fluid. Such a structure can allow heat from the first fluid to be recovered by the thermoelectric conversion element 20, as well as allow heat to be recovered from the first fluid to the second fluid by heat exchange. The inflow port 41 for the second fluid is preferably arranged on a side near the second end face 12, and the outflow port 42 for the second fluid is preferably arranged on a side near the first end face 11. This allows the second fluid to flow in the opposite direction to the first fluid (counter-flow), which will easily achieve stable heat recovery performance.

It is preferable to have a structure in which the outer peripheral surface at both ends in the axial direction of the cylindrical member 30 is circumferentially close to the inner peripheral surface of the casing 40 so as to prevent the second fluid from leaking out. A method of closely connecting the outer peripheral surface of the cylindrical member 30 to the inner peripheral surface of the casing 40 that can be used herein include welding, diffusion bonding, brazing, and the like, although not particularly limited thereto. Among these, the welding is preferred due to its high durability and reliability.

A material of the casing 40 is not particularly limited, but a material having good thermal conductivity is preferable. Examples of the material include metals and ceramics. Among them, the metals are preferable in terms of manufacturability (ease of assembly). The metals that can be used herein include stainless steel, titanium alloys, copper alloys, aluminum alloys, brass and the like. Among them, the stainless steel is preferable because of high durability and reliability.

The casing 40 preferably has a thickness of 0.1 mm or more, and more preferably 0.5 mm or more, and still more preferably 1 mm or more, in terms of durability and reliability. The thickness of the casing 40 is preferably 10 mm or less, and more preferably 5 mm or less, and still more preferably 3 mm or less, in terms of cost, volume and weight.

In cases such as when the heat recovery device 100 is used to recover exhaust heat from an exhaust gas of an engine, the casing 40 may be structured such that both end portions in a direction parallel to the axial direction of the honeycomb structure 10 can be connected to a pipe through which the exhaust gas of the engine passes. If the inner diameter of the pipe through which the exhaust gas passes is different from each inner diameter of the two end portions of the casing 40, a gas introducing pipe having a gradually increasing or decreasing inner diameter may be provided between the pipe and the casing 40, or the pipe and the casing 40 may be directly connected.

The second fluid is not particularly limited, but if the heat recovery device 100 serves as a heat exchanger installed in a motor vehicle, the second fluid is preferably water or antifreeze solution (LLC as defined in JIS K 2234:2006). Engine oil, ATF, or refrigerant Freon can also be used as the second fluid.

(1-5) Pressing Member 50

The pressing member 50 is a member that presses the cylindrical member 30 against the thermoelectric conversion element 20. As the cylindrical member 30 is pressed, the thermoelectric conversion element 20 on the inner peripheral side of the cylindrical member 30 is also pressed, thereby facilitating adhesion of the thermoelectric conversion element 20 to the honeycomb structure 10.

The pressing member 50 is not particularly limited, but for example, a screw 51 inserted from the outer peripheral side of the casing 40 can be used.

The screw 51 can be inserted from the outer peripheral side of the casing 40 to the cylindrical member 30 located inside, and can press the cylindrical member 30 at the tip of the screw 51. It is preferable to insert the screw 51 into a position where it can press down on the center of gravity of each thermoelectric conversion element 20. It is more preferable that each thermoelectric conversion element 20 is pressed by a plurality of screws 51, and it is even more preferable that the plurality of screws 51 are arranged in linear or point symmetry. The number of the screws 51 pressing each thermoelectric conversion element 20 is preferably 5 or more, and more preferably 9 or more.

The pressing member 50 may be a spring interposed between the casing 40 and the cylindrical member 30. In this case, a preferred arrangement of the spring is the same as that of the screw 51.

(1-6) Heat Transfer Member 60

A heat transfer member 60 can optionally be placed between the thermoelectric conversion element 20 and the cylindrical member 30. The placement of the heat transfer member 60 can provide effects of increasing the heat recovery efficiency, and further increasing the shape retaining effect by the cylindrical member 30. The heat transfer member 60 is preferably structured to fill a gap between the thermoelectric conversion element 20 and the cylindrical member 30 as much as possible.

For example, the heat transfer member 60 can have an inner peripheral shape that matches the outer peripheral shape of the thermoelectric conversion element 20, and an outer peripheral shape that matches the inner peripheral shape of the cylindrical member 30. FIG. 2 illustrates a case where the outer peripheral surface of the heat transfer member 60 forms a cylindrical surface as a whole and is fitted and fixed to the inner peripheral side surface of the cylindrical member 30, which is cylindrical.

A material of the heat transfer member 60 is not particularly limited, but a material having good thermal conductivity is preferable. Examples of the material include metals and ceramics. Among them, the metals are preferable in terms of manufacturability (ease of assembly). The metals that can be used herein include stainless steel, titanium alloys, copper alloys, aluminum alloys, brass and the like. Among them, the aluminum alloy is preferable because of its good processability and heat transfer property.

(2) Method for Producing Heat Recovery Device 100

Next, the method for producing the heat recovery device 100 according to Embodiment 1 of the present invention will be exemplarily described.

(2-1) Production of Honeycomb Structure 10

First, a green body containing ceramic powder is extruded into a desired shape to prepare a honeycomb formed body. The material of the honeycomb formed body that can be used herein includes the ceramics as described above. For example, when producing a honeycomb formed body containing a Si-impregnated SiC composite as a main component, a binder and water or an organic solvent are added to a predetermined amount of SiC powder, and the resulting mixture is kneaded to form a green body, which is formed into a honeycomb formed body having a desired shape. Then, the resulting honeycomb formed body can be dried, and the honeycomb formed body can be impregnated with metallic Si and fired under reduced pressure in an inert gas or vacuum to obtain a honeycomb structure 10 having a plurality of cells 13 defined by partition walls 14. As a method of forming the outer peripheral wall 15 having the planar outer peripheral surface, the outer peripheral wall 15 having the planar outer peripheral surface may be formed as the shape of the honeycomb molded body, or the outer peripheral wall 15 having the planar outer peripheral surface may be formed by performing outer peripheral coating after obtaining the cylindrical honeycomb structure 10. Also, the side surface of the cylindrical honeycomb structure 10 was polished to produce a polygonal pillar shaped honeycomb structure 10, and then the outer peripheral coating may be performed to form the outer peripheral wall 15 having the planar outer peripheral surface.

(2-2) Arrangement of Thermoelectric Conversion Element

Next, the desired number of thermoelectric conversion element 20 is arranged on the outer peripheral surface of the honeycomb structure 10. After arranging the heat transfer members 60 on the outer peripheral surfaces of the thermoelectric conversion element 20 as needed, the resulting assembly is inserted into the cylindrical member 30. In this state, the inner peripheral surface of the cylindrical member 30 is fitted and fixed to the outer peripheral surface of the assembly (e.g., the outer peripheral surfaces of the heat transfer members 60) by means of shrinkage fitting.

Thus, a core component is completed which includes the honeycomb structure 10, the thermoelectric conversion element 20 and the cylindrical member 30, and preferably further includes the heat transfer members 60. By forming the core component such that it does not disassemble unless force is applied externally, handling of the heat recovery device 100 is facilitated.

(2-3) Attachment of Casing 40

The casing 40 having the above components is formed by a method such as molding, bending and cutting, and the casing 40 is joined to the core component at an interval so as to form the flow path for the second fluid on a radially outer side of the cylindrical member 30 of the core component. Typically, the core component is inserted into the casing 40, and both can be joined to each other by a method such as welding and brazing.

By such a procedure, the heat recovery device 100 having the combination of the core components and the casing 40 can be produced. However, the method for producing the heat recovery device 100 according to Embodiment 1 of the present invention is not limited to the methods as described above.

Embodiment 2

Figure 4:
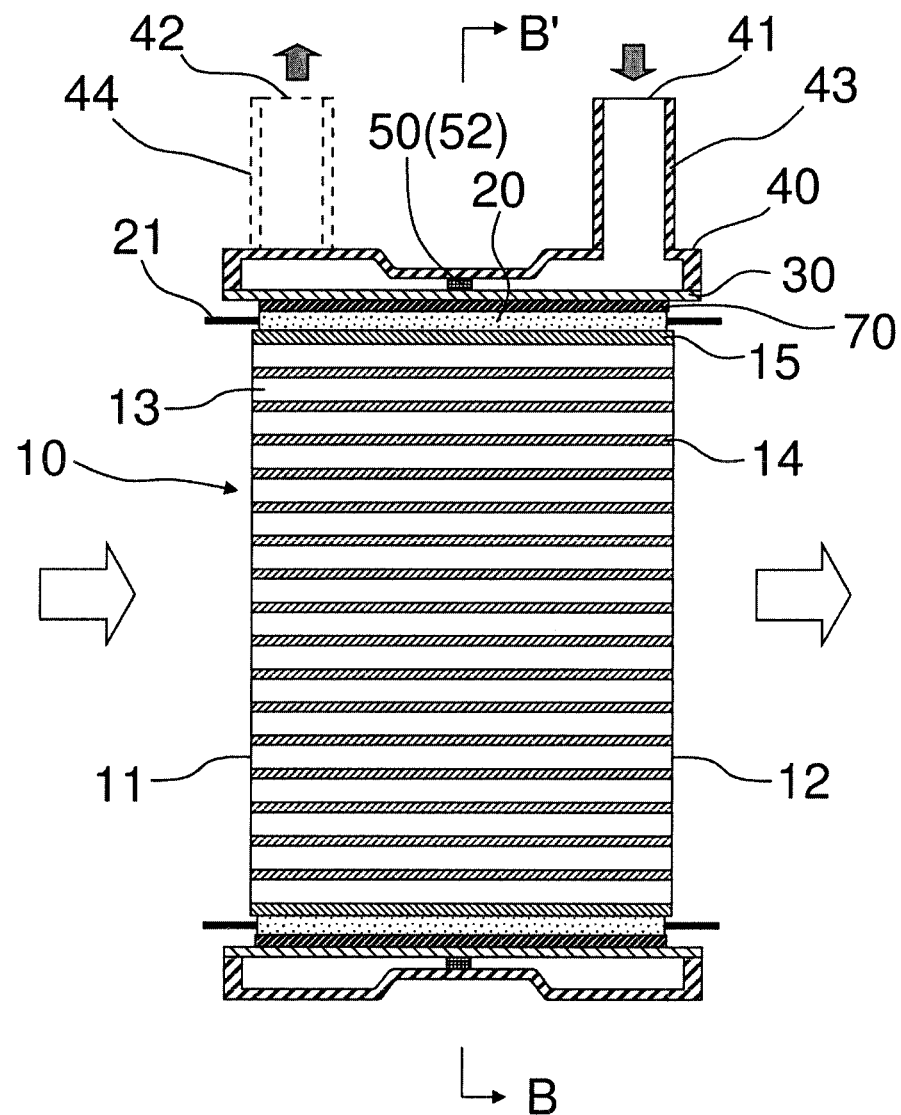
FIG. 4 is a view for explaining a structure of a heat recovery device according to Embodiment 2 of the present invention in a cross section parallel to an axial direction (a cell extending direction) of a honeycomb structure.
Figure 5:
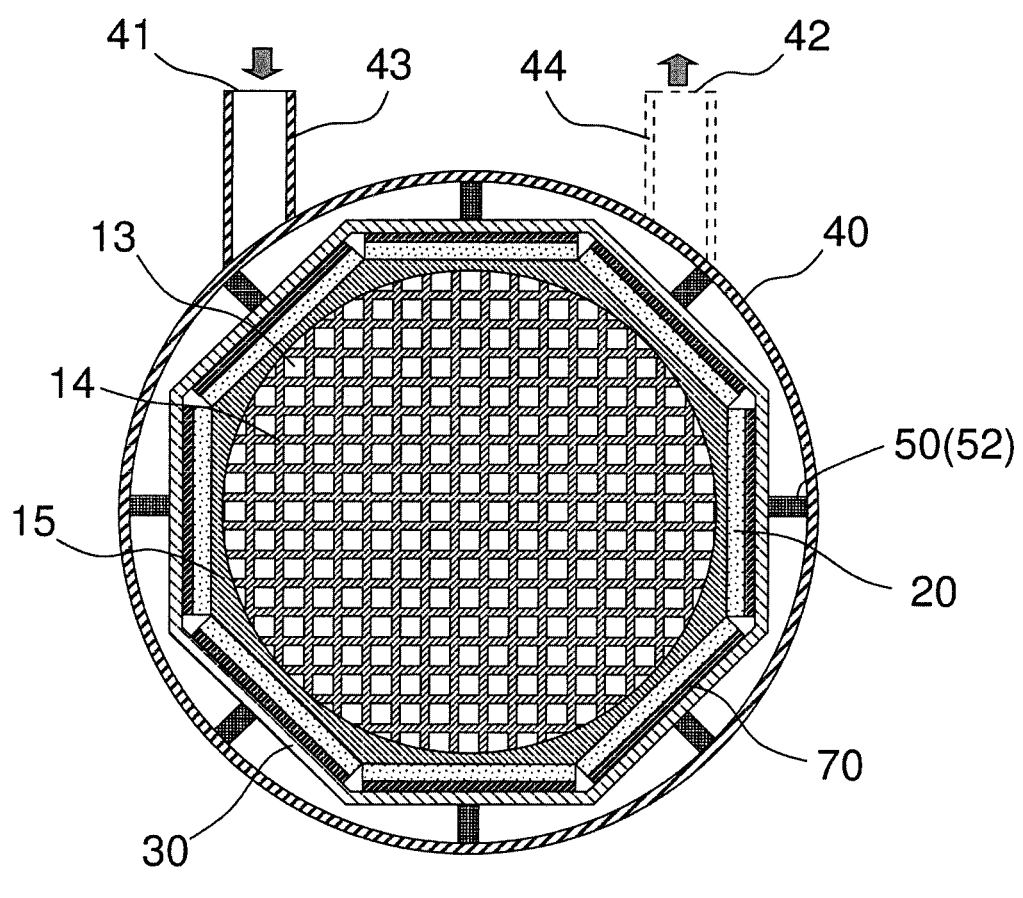
FIG. 5 is a view for explaining a structure of a heat recovery device according to Embodiment 2 of the present invention in a cross section orthogonal to an axial direction (a cell extending direction) of a honeycomb structure.

FIG. 4 shows a structure of a heat recovery device according to Embodiment 2 of the present invention in a cross section parallel to an axial direction of the honeycomb structure (a cell extending direction). FIG. 5 shows the structure of the heat recovery device according to Embodiment 2 of the present invention in a cross section (cross section taken along the line B-B') orthogonal to the axial direction (the cell extending direction) of the honeycomb structure.

The dotted lines in the figures are imaginary lines of an outflow port and an outlet conduit present in the other cross section.

In FIGS. 4 and 5, components indicated by the same reference numerals as those in FIGS. 1 and 2 are the same as those in FIGS. 1 and 2, and are therefore omitted from the detailed description.

As shown in FIGS. 4 and 5, a heat recovery device 200 according to Embodiment 2 of the present invention includes the honeycomb structure 10, the thermoelectric conversion element 20, the cylindrical member 30, the casing 40, and the pressing member 50, as in the heat recovery device 100 according to Embodiment 1 of the present invention. FIGS. 4 and 5 illustrates the case where springs 52 each interposed between the casing 40 and the cylindrical member 30 are used as the pressing member 50 as an example.

The heat recovery device 200 according to Embodiment 2 of the present invention is further provided with buffer member 70 which are disposed between the cylindrical member 30 and the thermoelectric conversion element 20 and are in contact with the inner peripheral surface of the cylindrical member 30.

By providing the buffer member 70, it is possible to suppress partial deformation of the cylindrical member 30 due to exposure to elevated temperature. Specifically, if the buffer member 70 is not provided, the cylindrical member 30 at a portion that is not pressed against the thermoelectric conversion element 20 by the pressing member 50 will be deformed, so that the pressing force against the thermoelectric conversion element 20 in that portion will be reduced, whereas the provision of the buffer member 70 can allow the thermal stress in that portion to be relaxed to suppress the deformation. As a result, even if the cylindrical member 30 is exposed to elevated temperature, the pressing force of the cylindrical member 30 against the thermoelectric conversion element 20 is difficult to decrease, so that the output of electric energy can be stably maintained.

The buffer member 70 is not limited as long as it has the above functions. For example, the buffer member 70 can be formed from a material having flexibility.

Each buffer member 70 preferably has a thermal conductivity of 2.0 W/m·K or higher and a heat resistant temperature of 100° C. or higher. The buffer member 70 having the thermal conductivity and heat resistant temperature in such ranges can prevent the function of the heat recovery device 200 from being degraded, thereby ensuring durability and reliability.

The buffer member 70 may be made of a material selected from graphite, silicon resins, and acrylic resins, for example. Such a material can provide the above effects.

Each buffer member 70 preferably has a thickness of from 0.5 to 2.0 mm, although not particularly limited thereto. The thickness of each buffer member 70 of 0.5 mm or more can stably suppress partial deformation of the cylindrical member 30. Also, the thickness of each buffer member 70 of 2.0 mm or less can suppress the functional degradation of the heat recovery device 200.

The heat recovery device 200 according to Embodiment 2 of the present invention can be provided with a slit portion 31 in the cylindrical member 30. By providing the slit portion 31 in the cylindrical member 30, an effect of suppressing partial deformation of the cylindrical member 30 by both the buffer member 70 and the slit portion 31 can be obtained.

The heat recovery device 200 according to Embodiment 2 of the present invention can be produced by the same method as that of the heat recovery device 100 according to Embodiment 1 of the present invention.

More particularly, after arranging the desired number of thermoelectric conversion element 20 on the outer peripheral surface of the honeycomb structure 10, the buffer member 70 is arranged on the outer peripheral surfaces of the thermoelectric conversion element 20, and the resulting assembly can be then inserted into the cylindrical member 30. In this state, the inner peripheral surface of the cylindrical member 30 is fitted and fixed to the outer peripheral surface of the assembly (e.g., the outer peripheral surfaces of the buffer member 70) by shrinkage fitting, thereby enabling a core component to be obtained. The core component is then inserted into the casing 40, and both are joined by a method such as welding and brazing to obtain the heat recovery device 200.

Embodiment 3

Figure 6:
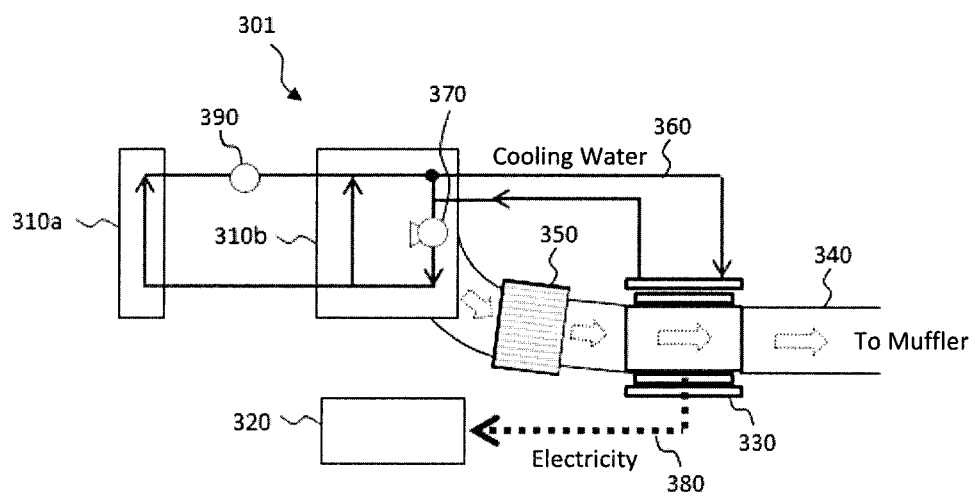
FIG. 6 is an arrangement example of a heat recovery system according to Embodiment 3 of the present invention.

FIG. 6 shows an arrangement example of a heat recovery system according to Embodiment 3 of the present invention.

A heat recovery system 301 according to Embodiment 3 of the present invention includes:

a one-way path 340 for a first fluid;

a circulation path 306 for a second fluid having a lower temperature than that of the first fluid;

a heat recovery device 330 according to Embodiment 1 or 2 of the present invention, which is arranged in the middle of the one-way path 340 for the first fluid and the circulation path 360 for the second fluid; and a battery 320 electrically connected to the heat recovery device 330, the battery 320 storing electricity generated by the heat recovery device 330.

The first fluid (e.g., an exhaust gas of a motor vehicle) flows from a source of the first fluid (e.g., an engine) into an inlet for the first fluid of the heat recovery device 330 while passing through the one-way path (e.g., an exhaust line) 340. When the one-way path 340 for the first fluid is an exhaust path from the engine, it is preferable to arrange an exhaust purification device 350 including a catalyst in the middle of the exhaust path and upstream of the heat recovery device 330. Although the exhaust purification device 350 including the catalyst may be arranged downstream of the heat recovery device 330, it is not desirable because the exhaust gas having a lowered temperature flows into the exhaust purification device 350 and the catalyst performance may not be sufficiently exerted.

The second fluid (e.g., a cooling water) having a temperature lower than that of the first fluid flows into the inflow port for the second fluid of the heat recovery device 330 while passing through the circulation path 360. The second fluid can be circulated through the circulation path 360 by a pump 370 disposed in the circulation path 360. If the heat recovery device 330 according to Embodiment 1 or 2 of the present invention is disposed in a motor vehicle, a cooling water pump disposed in the engine may be used as the pump 370.

In the heat recovery device 330, the thermoelectric conversion element 20 generates electricity by utilizing a difference between the temperatures of the first and second fluids. The generated electricity is stored in the battery 320 via an electric wire 380. The second fluid, which has received heat from the first fluid through heat exchange in the heat recovery device 330, flows out of an outlet for the second fluid of the heat recovery device 330 and flows through the circulation path 360. It is more preferable that the heat of the second fluid that has received the heat is then recovered by heat receiving devices 310a, 310b, in terms of improving the heat recovery efficiency. When the system includes the heat receiving devices 310a, 310b, the second fluid is cooled by the heat receiving devices 310a, 310b that receive the heat from the second fluid, and then returns to the heat recovery device 330 again through the circulation path 360. The first fluid that has flowed out of the outlet for the first fluid of the heat recovery device 330 passes through the one-way path 340 and is fed to the next step. For example, when the first fluid is an exhaust gas from a motor vehicle, it is released to the atmosphere after exhaust sound is reduced by a muffler.

Non-limiting examples of the heat receiving devices that receive heat from the second fluid include radiators and engines. In particular, a case where the second fluid is the cooling water for the engine and the heat receiving devices that receive heat from the second fluid are the engine and the radiator is described below with reference to FIG. 6. In general, the circulation path is formed such that the cooling water circulates between an engine 310b and a radiator 310a. In the circulation path, a thermostat 390 is arranged. At the time when the engine 310b is cold and a temperature of the cooling water is lower, such as at the time of startup, the thermostat is closed and the cooling water circulates through the engine 310b (more precisely, through a water jacket on the engine) for warming-up. When the temperature of the cooling water reaches a high temperature up to a predetermined opening temperature, the thermostat 390 opens and the cooling water begins to circulate between the engine 310b and the radiator 310a.

When the thermostat is closed at the engine startup, the engine is in a cold state, and this is a situation where the warming-up is required. According to the embodiment shown in FIG. 6, the circulation path for the second fluid includes a path where a portion of the second fluid (cooling water) circulating in the engine 310b is drown out by branching, passes through the heat recovery device 330, and then returns to the engine 310b again. This can allow the heat recovered by the heat recovery device 330 to be used for warming-up of the engine. In other words, in this situation, the engine 310b will be the heat receiving device that receives heat from the second fluid. Therefore, according to the heat recovery system 301 according to Embodiment 3 of the present invention, at the engine startup, the heat recovered by the second fluid can be used for warming-up of the engine 310b in addition to power generation by thermoelectric conversion, and furthermore, it can contribute to improvement of a fuel efficiency.

On the other hand, in a situation where the temperature of the engine 310b is increased and the cooling water (second fluid) is circulated between the radiator 310a and the engine 310b, the heat recovered by the second fluid cannot be used for warming-up of the engine 310b. However, according to the embodiment shown in FIG. 6, the circulation path for the second fluid includes a path where the second fluid flowing out of the heat recovery device 330 passes through the radiator 310a and then returns to the heat recovery device 330 again. As a result, the heat recovered by the second fluid in the heat recovery device 330 is removed by the radiator 310a to cool the second fluid, and then the heat can be used for thermoelectric conversion in the heat recovery device 330 again. In other words, in this situation, the radiator 310a will be the heat receiving device that receives heat from the second fluid.

DESCRIPTION OF REFERENCE NUMERALS 10 honeycomb structure
11 first end face 12 second end face
13 cell
14 partition wall
15 outer peripheral wall
20 thermoelectric conversion element
21 electric wire
30 cylindrical member
31 slit portion
40 casing
41 inflow port
42 outflow port
43 inlet conduit
44 outlet conduit
50 pressing member
51 screw
52 spring
60 heat transfer member
70 buffer member
100,200 heat recovery device
301 heat recovery system
310a heat receiving device (radiator) that receives heat from second fluid
310b heat receiving device (engine) that receives heat from second fluid
320 battery
330 heat recovery device
340 one-way path for first fluid
360 circulation path for second fluid
370 pump
380 electric wire
390 thermostat

The invention claimed is:

1. A heat recovery device, comprising:
a honeycomb structure comprising an outer peripheral wall having at least one planar outer peripheral surface, and partition walls arranged on an inner side of the outer peripheral wall, the partition walls defining a plurality of cells each extending from a first end face to a second end face to form a flow path for a first fluid;
a thermoelectric conversion element arranged to face the planar outer peripheral surface of the outer peripheral wall;
a cylindrical member that circumferentially covers the honeycomb structure in which the thermoelectric conversion element is arranged;
a casing arranged at an interval so as to form a flow path for a second fluid, the casing being arrange on a radially outer side of the cylindrical member; and
a pressing member being configured to press the cylindrical member against the thermoelectric conversion element,
wherein the cylindrical member has one or more slit portions.

2. The heat recovery device according to claim 1, wherein the slit portions are provided on an outer peripheral surface, an inner peripheral surface, or both of them of the cylindrical member.

3. The heat recovery device according to claim 1, wherein the slit portions are provided at positions that do not overlap with at least one pressing point of the pressing member.

4. The heat recovery device according to claim 1, wherein the slit portions are provided in a mesh pattern.

5. The heat recovery device according to claim 1, wherein the pressing member is a screw inserted from an outer peripheral side of the casing.

6. The heat recovery device according to claim 1, further comprising buffer member, the buffer member being arranged between the cylindrical member and the thermoelectric conversion element and being in contact with an inner peripheral surface of the cylindrical member.

7. A heat recovery system, comprising:
a one-way path for a first fluid;
a circulation path for a second fluid having a lower temperature than that of the first fluid;
the heat recovery device according to claim 1, the heat recovery device being arranged in the middle of the one-way path for the first fluid and the circulation path for the second fluid; and
a battery electrically connected to the heat recovery device, the battery storing electricity generated by the heat recovery device.

8. The heat recovery system according to claim 7, further comprising at least one heat receiving device arranged in the middle of the circulation path for the second fluid, the heat receiving device receiving heat from the second fluid flowing out of the outflow port for the second fluid of the heat recovery device.

9. A heat recovery system according to claim 7, wherein the one-way path for the first fluid is an exhaust path from an engine, and wherein an exhaust purification device comprising a catalyst is disposed in the middle of the exhaust path and upstream of the heat recovery device.

10. A heat recovery device, comprising:
a honeycomb structure comprising an outer peripheral wall having at least one planar outer peripheral surface, and partition walls arranged on an inner side of the outer peripheral wall, the partition walls defining a plurality of cells each extending from a first end face to a second end face to form a flow path for a first fluid;
a thermoelectric conversion element arranged to face the planar outer peripheral surface of the outer peripheral wall;
a cylindrical member that circumferentially covers the honeycomb structure in which the thermoelectric conversion element is arranged;
a casing arranged at an interval so as to form a flow path for a second fluid, the casing being arrange on a radially outer side of the cylindrical member;
a pressing member being configured to press the cylindrical member against the thermoelectric conversion element; and
a buffer member arranged between the cylindrical member and the thermoelectric conversion element, the buffer member being in contact with an inner surface of the cylindrical member;
wherein the buffer member is made of a material selected from graphite, silicone resins, and acrylic resins.

11. The heat recovery device according to claim 10, wherein the buffer member has a thickness of from 0.5 to 2.0 mm.

12. The heat recovery device according to claim 10, wherein the buffer member has a thermal conductivity of 2.0 W/m·K or more and a heat resistant temperature of 100° C. or more.

* * * * *